(12) United States Patent
Xu

(10) Patent No.: US 10,297,795 B2
(45) Date of Patent: May 21, 2019

(54) TREATMENT METHOD OF EMITTING LAYER RAW MATERIAL IN OLED AND APPLICATION

(71) Applicant: Wuhan China Star Optoelectronics Technology Co., Ltd., Wuhan, Hubei (CN)

(72) Inventor: Jie Xu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 165 days.

(21) Appl. No.: 15/535,698

(22) PCT Filed: Apr. 25, 2017

(86) PCT No.: PCT/CN2017/081804
§ 371 (c)(1),
(2) Date: Jun. 13, 2017

(87) PCT Pub. No.: WO2018/184264
PCT Pub. Date: Oct. 11, 2018

(65) Prior Publication Data
US 2018/0366686 A1   Dec. 20, 2018

(30) Foreign Application Priority Data

Apr. 5, 2017   (CN) .......................... 2017 1 0219062

(51) Int. Cl.
*H01L 51/56*   (2006.01)
*H01L 51/50*   (2006.01)
(Continued)

(52) U.S. Cl.
CPC .............. *H01L 51/56* (2013.01); *C23C 14/24* (2013.01); *H01L 51/0008* (2013.01);
(Continued)

(58) Field of Classification Search
CPC . H01L 51/56; H01L 51/5012; H01L 51/0008; H01L 51/5056; H01L 51/5072;
(Continued)

(56) References Cited

U.S. PATENT DOCUMENTS

2003/0136459 A1 * 7/2003 Laycock ................ D03D 15/08
139/421
2005/0056968 A1   3/2005 Ghosh et al.
2018/0340033 A1 * 11/2018 Price ...................... C08F 14/18

FOREIGN PATENT DOCUMENTS

CN          1853000 A      10/2006
CN        101295772 A      10/2008
(Continued)

*Primary Examiner* — Roy K Potter
(74) *Attorney, Agent, or Firm* — Andrew C. Cheng

(57) ABSTRACT

Provided is a treatment method of an emitting layer raw material in an OLED, comprising steps of: (1) providing the emitting layer raw material, and the emitting layer raw material comprising a host and a dopant, and in a vacuum glove box with protective gas, adding the host, the dopant and anhydrous ethanol into a polytetrafluoroethylene lining to be mixed uniformly, and putting the lining in a high pressure autoclave to be treated at a temperature of 40 to 60 celsius degrees for 18 to 36 hours to obtain a treatment liquid; (2) centrifuging the treatment liquid to collect a precipitate, and drying the collected precipitate to obtain the emitting layer raw material after treatment. The resulting treated emitting layer raw material achieves sufficient mixing and dispersion of the host and the dopant, and does not affect the subsequent use of vacuum evaporation method to form an emitting layer.

16 Claims, 1 Drawing Sheet

(51) Int. Cl.
  *H01L 51/00*  (2006.01)
  *C23C 14/24*  (2006.01)
  *H01L 51/52*  (2006.01)

(52) U.S. Cl.
  CPC ...... *H01L 51/5012* (2013.01); *H01L 51/5056* (2013.01); *H01L 51/5072* (2013.01); *H01L 51/5092* (2013.01); *H01L 51/5206* (2013.01)

(58) Field of Classification Search
  CPC ............. H01L 51/5092; H01L 51/5206; H01L 33/0083; H01L 33/285; H01L 33/025; C23C 14/24
  See application file for complete search history.

(56) References Cited

FOREIGN PATENT DOCUMENTS

| | | |
|---|---|---|
| CN | 103219473 A | 7/2013 |
| CN | 104592991 A | 5/2015 |
| CN | 104882546 A | 9/2015 |
| CN | 106206974 A | 12/2016 |
| JP | 2011243337 A | 12/2011 |

\* cited by examiner

TREATMENT METHOD OF EMITTING LAYER RAW MATERIAL IN OLED AND APPLICATION

CROSS REFERENCE

This application claims the priority of Chinese Patent Application No. 2017102190625, entitled "Treatment method of emitting layer raw material in OLED and application", filed on Apr. 5, 2017, the disclosure of which is incorporated herein by reference in its entirety.

FIELD OF THE INVENTION

The present invention relates to an OLED technical field, and more particularly to a treatment method of an emitting layer raw material in an OLED and an application.

BACKGROUND OF THE INVENTION

Because the organic electroluminescent diode (OLED) possesses advantages of self-luminous, fast response, wide viewing angle, high brightness and light weight, the potential market looks to further increase in the industry. The structure of the basic OLED mainly comprises an anode, a hole injection layer, a hole transporting layer, an emitting layer, an electron transporting layer, an electron injection layer and a cathode. The emitting layer of OLED has a concentration quenching. If a single emitting material is employed as an emitting layer, it will greatly reduce the light emitting efficiency thereof. At present, the OLED emitting layer is usually formed by the host and the dopant with a total evaporation.

The vacuum evaporation is a process of placing the material to be film into a vacuum environment for evaporation or sublimation to cause to precipitate on the surface of the substrate. The process generally comprises the process of thermal evaporation, and the flight process and deposition process of gasified atoms or molecules in the atmosphere. Before the deposition, the doping ratio of the dopant and the host is generally designed to be the ratio for maximally increasing the light emitting efficiency. However, in the flight process of gasified atoms or molecules in the vacuum evaporation, due to the different dissipation of the host material and the dopant material, the doping ratio of the final emitting material changes, and the light emitting efficiency is lowered.

SUMMARY OF THE INVENTION

On this account, the present invention provides a treatment method of an emitting layer raw material in an OLED. The method comprises implements alcohol heat treatment to a host and a dopant, the raw materials of forming the emitting layer to obtain the emitting layer raw material after treatment. This allows the two materials to be dissipated in the same proportion as forming the emitting layer by vacuum evaporation. The designed optimal doping ratio before vacuum evaporation almost has no change to reduce the effect on the light emitting efficiency.

First, the present invention provides a treatment method of an emitting layer raw material in an OLED, comprising steps of:

(1) providing the emitting layer raw material, and the emitting layer raw material comprising a host and a dopant, and in a vacuum glove box with protective gas, adding the host, the dopant and anhydrous ethanol into a polytetrafluoroethylene lining to be mixed uniformly to obtain a mixed solution, and putting the lining in a high pressure autoclave to be treated at a temperature of 40 to 60 celsius degree for 18 to 36 hours to obtain a treatment liquid;

(2) centrifuging the treatment liquid to collect a precipitate, and drying the collected precipitate to obtain the emitting layer raw material after treatment.

In the present application, the emitting layer raw material after treatment can be used for vacuum evaporation to produce an organic electroluminescent element.

In the treatment method first provided by the present invention, the emitting layer raw material—the host and the dopant have no sufficient energy to complete the crystallization but it can achieve the more fully mixture and dispersion of the two, and the subsequent use of vacuum evaporation method to form the emitting layer will not be affected. More importantly, it is ensured that the host and the dopant after treatment are dissipated in the same manner even if the materials are dissipated during the evaporation process and does not affect the light emitting efficiency of the final emitting layer, which is beneficial for uniformly distributing the area of forming exciton in the entire emitting layer and improving the performance and the service life of the OLED device.

In the present application, the temperature of the treatment is not so high that the host and the dopant cannot be effectively gasified, resulting in failure to be deposited as the emitting layer. Furthermore, a temperature of the treatment is 40 to 55 celsius degrees.

Preferably, a time of the treatment is 20 to 30 hours. The time of alcohol heat treatment cannot be too long, so as not to affect the host and dopant not being effectively deposited into the emitting layer.

A filling degree of the anhydrous ethanol in the polytetrafluoroethylene lining is 70 to 80 degrees. A volume of the anhydrous ethanol is 75% to 80% of a volume of the polytetrafluoroethylene lining.

In step (1), a concentration of the host in the mixed solution is 0.2 to 0.6 mol/L.

Preferably, a mass of the dopant does not exceed 3% of a mass of the host.

Preferably, the vacuum glove box with protective gas is a glove box is evacuated, and then the protective gas is passed. Specifically, before the experiment, the emitting layer raw material, anhydrous ethanol, the high pressure autoclave and the lining are preliminarily placed in the glove box, and after the glove box is vacuumed, the protective gas is passed.

The protective gas comprises one or more of nitrogen and argon.

Preferably, a speed of centrifuging is 8,000 to 10,000 r/min. For instance, the speed of centrifuging can be 8,500, 9,000 or 9,500 r/min; a time of centrifuging can be 5-20 mins.

In the present invention, both the host and the dopant are common emitting materials in the OLED field. The energy levels of the two are matched so that the good carrier transporting balance and the energy transfer between the dopant and host can be achieved in the formed emitting layer. The host has the electron transporting energy, which can effectively make the recombination of electrons and holes excited to the emitting conversion of the dopant. The dopant is preferably a substance that emitting light from a triplet excited state at room temperature.

Preferably, a triplet energy gap (EgT(Host)) of the host is larger than a triplet energy gap (EgT(Dopant)) of the dopant.

Thus, the energy of the host is effectively moved to the dopant in the emitting layer to further improve the light emitting efficiency.

Specifically, a material of the host can be an amine derivative, a carbazole derivative, an oxadiazole derivative, a triazole derivative, a benzoxazole-based derivative, a benzothiazole derivative for illustration but is not limited thereto. Preferably, a material of the host is a carbazole derivative (such as mCP, CBP), DPEPO and the like, and their structures are as follows:

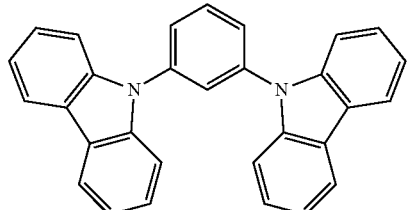

(mCP, 1,3-Bis(carbazol-9-yl)benzene)

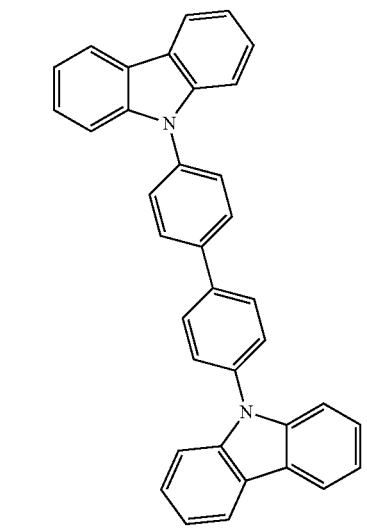

(CBP, 4,4'-Bis(9-carbazolyl)-1,1'-biphenyl)

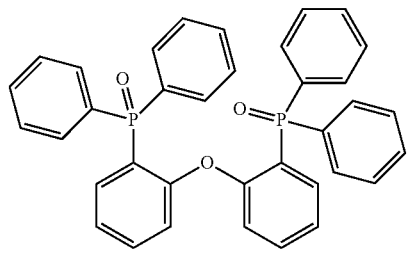

(DPEPO, Bis[2-((oxo)diphenylphosphino)phenyl] ether)

A material of the dopant can be DPS-DMAC, BP-carbazole, BP-DMOC and the like as illustrations shown as follows, and their structures are as follows:

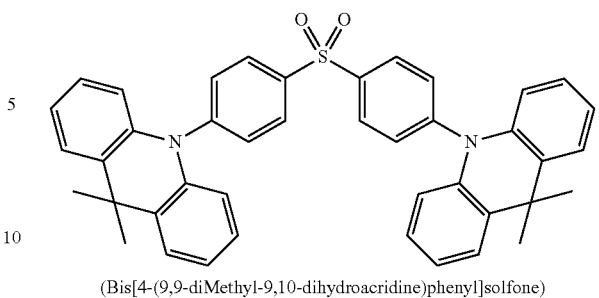

(Bis[4-(9,9-diMethyl-9,10-dihydroacridine)phenyl]solfone)

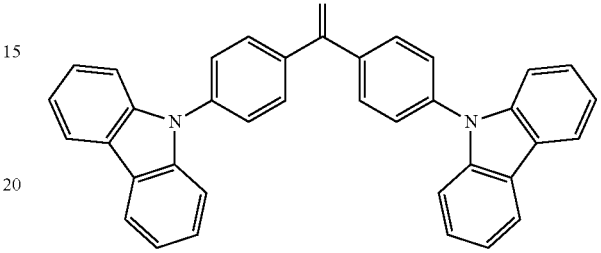

(BP-carbazole, 4,4'-Bis(9-carbazolyl)-1,1'-benzophenone)

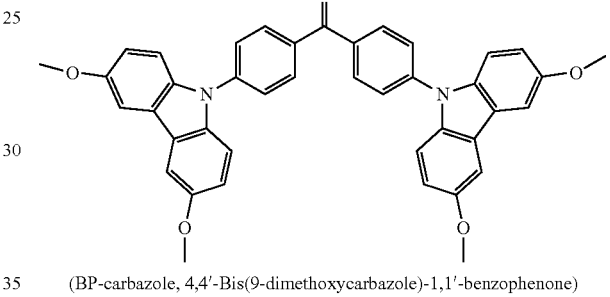

(BP-carbazole, 4,4'-Bis(9-dimethoxycarbazole)-1,1'-benzophenone)

Second, the present invention provides a manufacturing method of an organic electroluminescent element, comprising steps of:

providing an anode conductive substrate, and manufacturing a hole injection layer, a hole transporting layer, an emitting layer, an electron transporting layer, an electron injection layer and a cathode on a conductive anode layer of the anode conductive substrate in order to obtain an organic electroluminescent element; wherein the emitting layer is obtained by implementing vacuum evaporation to the emitting layer raw material after treatment which is first provided by the present invention.

In the present invention, the hole injection layer, the hole transporting layer, the electron transporting layer and the electron injection layer can be manufactured by the vacuum evaporation or the solution method; The cathode on the electron injection layer can be realized by using conventional processes, such as the vacuum evaporation process or the sputtering method.

The layers of the organic electroluminescent element are conventional in this field. For instance, the substrate may be made of glass, plastic, quartz or other flexible material. A material of the anode layer can utilize one or more of conductive metal oxide (ITO, FTO, CTO), conductive metal (Ag, Al), and alloy. A material of the hole injection layer may be CuPc, MeO-TPD, HATCN, PEDOT: PSS, MoxOx, VxOy, etc; A material of the hole transporting layer may be NPB, TPD, TAPC, TFB, OTPD, QTPD, Poly-TPD, PVK, etc; A material of the electron transporting layer may be TPBI, PBD, BCP, Bphen, TAZ, TmPyPB, etc; A material of the electron injecting layer may be LiF, LiQ, CsF, CsCO3, ZnO/PEI, ZnO/PEIE, PFN, PFN-Br, etc. A metal material, such as Ag or Mg can be used for the cathode.

In the manufacturing method of the organic electroluminescent element second provided by the present invention, the emitting layer obtained by implementing vacuum evaporation to the emitting layer raw material after treatment which is first provided by the present invention is utilized. Compared to the prior art, in which the dopant is deposited directly on the host, the external quantum effect of the organic electroluminescent element of the present invention is higher (about 20%), and is basically equal to the efficiency achieved by the designed optimal doping ratio of the host and the dopant before vacuum evaporation. For the direct evaporation using the existing method of prior art, the light emitting efficiency is only about 10%. Therefore, the method second provided by the present invention can overcome the low yield of the emitting layer of the conventional vacuum evaporation and the drawbacks of the more reduction for the light emitting efficiency in the deposition.

BRIEF DESCRIPTION OF THE DRAWINGS

FIG. 1 is a structure diagram of an organic electroluminescent element of in the second embodiment of the present invention.

DETAILED DESCRIPTION OF PREFERRED EMBODIMENTS

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

Embodiment One

A treatment method of an emitting layer raw material in an OLED, comprises steps of:

(1) raw material preparation: preparing 5 g of a material mCP of a host, 0.15 g of a material DPS-DMAC of dopant, and preparing 40 mL of anhydrous ethanol;

(2) equipment preparation: preliminarily placing the foregoing raw material, anhydrous ethanol, the high pressure autoclave and the lining in the glove box, and vacuuming the glove box, and then passing nitrogen to form a vacuum glove box environment with nitrogen;

(3) adding 5 g of mCP, 0.15 g of DPS-DMAC in 50 mL of a polytetrafluoroethylene lining, and then adding 40 mL of anhydrous ethanol to be mixed uniformly to obtain a mixed solution, wherein a concentration c(mCP) of the mCP in the mixed solution is 0.3064 mol/L; and placing the lining containing the mixed solution in a high pressure autoclave to be treated at a temperature of 50 celsius degrees for 24 hours to obtain a treatment liquid;

(4) centrifuging the treatment liquid at 9,000 r/min for 10 mins to collect a precipitate, and drying the collected precipitate to obtain the emitting layer raw material after treatment.

The structures of the material mCP of the host and the material DPS-DMAC of the dopant used in this embodiment are as follows:

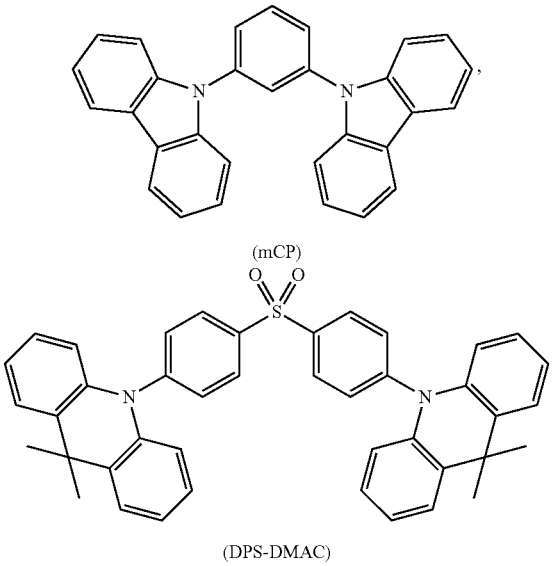

(mCP)

(DPS-DMAC)

Embodiment Two

A manufacturing method of an organic electroluminescent element, comprising steps of:

providing a glass substrate having a patterned conductive anode layer, and manufacturing a hole injection layer, a hole transporting layer on the conductive anode layer of the anode conductive substrate by vacuum evaporation in order;

on the hole transporting layer, implementing vacuum evaporation with the emitting layer raw material after treatment produced by the embodiment one to obtain an emitting layer (i.e. a doped emitting layer);

manufacturing an electron transporting layer, an electron injection layer and a cathode on the emitting layer by vacuum evaporation in order to obtain the organic electroluminescent element.

FIG. 1 is a structure diagram of an organic electroluminescent element of in the second embodiment of the present invention. 1 is an anode conductive substrate can be indium tin oxide (commonly known as ITO) conductive glass, and 2 is a hole injection layer, and 3 is a hole transporting layer, and 4 is an emitting layer, and 5 is an electron transporting layer, and 6 is an electron injection layer, and 7 is a cathode, and the cathode 7 is a magnesium/silver mixture. The mCP material of the host and the material of the dopant are uniformly dispersed in the emitting layer 4, which is beneficial for uniformly distributing the area of forming exciton in the entire emitting layer.

Comparative Embodiment One

A manufacturing method of an organic electroluminescent element, comprising steps of:

providing a glass substrate having a patterned conductive anode layer, and manufacturing a hole injection layer, a hole transporting layer on the conductive anode layer of the anode conductive substrate by vacuum evaporation in order;

on the hole transporting layer, implementing vacuum evaporation with 5 g of the material mCP of the host, and then, evaporating 0.15 g of material DPS-DMAC of the dopant to form an emitting layer;

manufacturing an electron transporting layer, an electron injection layer and a cathode on the emitting layer by vacuum evaporation in order to obtain the organic electroluminescent element.

The external quantum effect of the organic electroluminescent element manufactured by the embodiment two of the present invention is higher (can reach 23%) in the blue wavelength (450-470 nm), which is basically equal to the light emitting efficiency achieved by the designed optimal doping ratio of the host and the dopant (3%) before vacuum evaporation. The light emitting efficiency of the organic electroluminescent element obtained in comparative embodiment one is only 10% and only reaches 50% of the light emitting efficiency achieved by the designed optimal doping ratio before vacuum evaporation. This is mainly due to the fact that the host and the dopant are not dissipated in the same proportion in the vacuum evaporation to result in that the doping ratio of the final formed emitting layer deviates from the optimal ratio to lead to the reduced light emitting efficiency.

With the comparison and explanation above, the present invention provides a treatment method of an emitting layer raw material in an OLED. By utilizing the treatment method of the emitting layer raw material provided by the present invention, it allows the two materials to be dissipated in the same proportion as forming the emitting layer by vacuum evaporation. The designed optimal doping ratio before vacuum evaporation almost has no change to overcome the low yield of the emitting layer of the conventional vacuum evaporation and the drawbacks of the more reduction for the light emitting efficiency in the deposition while keeping the low cost advantage of the vacuum evaporation process at the same time.

Embodiment Three

A treatment method of an emitting layer raw material in an OLED, of which the steps are basically the same as those of embodiment one. The difference is: taking 3 g of the material CBP of the host and 0.06 g of the material BP-carbazole of the dopant, and adding 35 mL of anhydrous ethanol to be treated at a temperature of 60 celsius degrees for 18 hours to obtain a treatment liquid;

and then, centrifuging the treatment liquid at 8,000 r/min for 8 mins to collect a precipitate, and drying the collected precipitate to obtain the emitting layer raw material after treatment.

While the emitting layer raw material after treatment produced by the embodiment is used for implementing vacuum evaporation of the emitting layer in the organic electroluminescent element, the light emitting efficiency of the organic electroluminescent element can reach 20%.

Embodiment Four

A treatment method of an emitting layer raw material in an OLED, of which the steps are basically the same as those of embodiment one. The difference is: taking 4 g of the material DPEPO of the host and 0.1 g of the material BP-DMOC of the dopant, and adding 37.5 mL of anhydrous ethanol to be treated at a temperature of 40 celsius degrees for 16 hours to obtain a treatment liquid;

and then centrifuging the treatment liquid at 10,000 r/min for 5 mins to collect a precipitate, and drying the collected precipitate to obtain the emitting layer raw material after treatment.

While the emitting layer raw material after treatment produced by the embodiment is used for implementing vacuum evaporation of the emitting layer in the organic electroluminescent element, the light emitting efficiency of the organic electroluminescent element can reach 22%.

The above-described embodiment is merely the expression of several embodiments of the present invention, the description is more specific and detailed, but it cannot be construed as limiting the scope of the invention. It should be noted that any persons who are skilled in the art change or replacement which is easily derived should be covered by the protected scope of the invention. Thus, the protected scope of the invention should go by the subject claims. Accordingly, the scope of the present invention patent protection should prevail in the appended claims.

What is claimed is:

1. A treatment method of an emitting layer raw material in an OLED, comprising steps of:
   (1) providing the emitting layer raw material, and the emitting layer raw material comprising a host and a dopant, and in a vacuum glove box with protective gas, adding the host, the dopant and anhydrous ethanol into a polytetrafluoroethylene lining to be mixed uniformly to obtain a mixed solution, and putting the lining in a high pressure autoclave to be treated at a temperature of 40 to 60 celsius degree for 18 to 36 hours to obtain a treatment liquid;
   (2) centrifuging the treatment liquid to collect a precipitate, and drying the collected precipitate to obtain the emitting layer raw material after treatment.

2. The treatment method according to claim 1, wherein a temperature of the treatment is 40 to 55 celsius degrees.

3. The treatment method according to claim 1, wherein a time of the treatment is 20 to 30 hours.

4. The treatment method according to claim 1, wherein a filling degree of the anhydrous ethanol in the polytetrafluoroethylene lining is 70 to 80 degrees.

5. The treatment method according to claim 1, wherein a concentration of the host in the mixed solution is 0.2 to 0.6 mol/L.

6. The treatment method according to claim 1, wherein a mass of the dopant does not exceed 3% of a mass of the host.

7. The treatment method according to claim 1, wherein the vacuum glove box with protective gas is a glove box is evacuated, and then the protective gas is passed.

8. The treatment method according to claim 1, wherein the protective gas comprises one or more of nitrogen and argon.

9. The treatment method according to claim 1, wherein a speed of centrifuging is 8,000 to 10,000 r/min; and a time of centrifuging is 5-20 mins.

10. The treatment method according to claim 1, wherein a triplet energy gap of the host is larger than a triplet energy gap of the dopant.

11. A manufacturing method of an organic electroluminescent element, comprising steps of:
   (1) providing the emitting layer raw material, and the emitting layer raw material comprising a host and a dopant, and in a vacuum glove box with protective gas, adding the host, the dopant and anhydrous ethanol into a polytetrafluoroethylene lining to be mixed uniformly to obtain a mixed solution, and putting the lining in a high pressure autoclave to be treated at a temperature of 40 to 60 celsius degree for 18 to 36 hours to obtain a treatment liquid;
   (2) centrifuging the treatment liquid to collect a precipitate, and drying the collected precipitate to obtain the emitting layer raw material after treatment;

(3) providing an anode conductive substrate, and manufacturing a hole injection layer, a hole transporting layer on a conductive anode layer of the anode conductive substrate in order;

on the hole transporting layer, implementing vacuum evaporation with the foregoing emitting layer raw material after treatment to obtain an emitting layer;

manufacturing an electron transporting layer, an electron injection layer and a cathode on the emitting layer in order to obtain the organic electroluminescent element.

12. The manufacturing method according to claim 11, wherein a temperature of the treatment is 40 to 55 celsius degrees.

13. The manufacturing method according to claim 11, wherein a time of the treatment is 20 to 30 hours.

14. The manufacturing method according to claim 11, wherein a concentration of the host in the mixed solution is 0.2 to 0.6 mol/L.

15. The manufacturing method according to claim 11, wherein a mass of the dopant does not exceed 3% of a mass of the host.

16. The manufacturing method according to claim 11, wherein a material of the conductive anode layer is selected from one or more of conductive metal oxide, conductive metal, and alloy.

* * * * *